United States Patent
Lim et al.

(10) Patent No.: US 10,854,788 B2
(45) Date of Patent: Dec. 1, 2020

(54) METHOD FOR PRODUCING AN OPTOELECTRONIC COMPONENT AND OPTOELECTRONIC COMPONENT

(71) Applicant: OSRAM Opto Semiconductors GmbH, Regensburg (DE)

(72) Inventors: Choo Kean Lim, Penang (MY); Choon Keat Or, Penang (MY); Choon Kim Lim, Penang (MY); Ai Cheng Chan, Penang (MY)

(73) Assignee: OSRAM OLED GMBH, Regensburg (DE)

( * ) Notice: Subject to any disclaimer, the term of this patent is extended or adjusted under 35 U.S.C. 154(b) by 0 days.

(21) Appl. No.: 16/311,676

(22) PCT Filed: Jul. 6, 2017

(86) PCT No.: PCT/EP2017/066950
§ 371 (c)(1),
(2) Date: Dec. 19, 2018

(87) PCT Pub. No.: WO2019/007513
PCT Pub. Date: Jan. 10, 2019

(65) Prior Publication Data
US 2020/0135980 A1 Apr. 30, 2020

(51) Int. Cl.
*H01L 33/48* (2010.01)
*H01L 21/683* (2006.01)
(Continued)

(52) U.S. Cl.
CPC ........ *H01L 33/486* (2013.01); *H01L 21/6836* (2013.01); *H01L 33/505* (2013.01);
(Continued)

(58) Field of Classification Search
CPC . H01L 33/486; H01L 21/6836; H01L 33/505; H01L 33/508; H01L 33/54;
(Continued)

(56) References Cited

U.S. PATENT DOCUMENTS

2006/0157828 A1* 7/2006 Sorg .................... H01L 31/0203
257/666
2013/0017632 A1 1/2013 Chen
(Continued)

FOREIGN PATENT DOCUMENTS

DE 102014114372 A1 4/2016

OTHER PUBLICATIONS

Ceramos Gen C 4, Datasheet, Version 1.1, CW VHLPD2.EN, OSRAM OS Datasheet, OSRAM Opto Semiconductors, Jul. 12, 2017, 21 pages.
(Continued)

*Primary Examiner* — Shahed Ahmed
(74) *Attorney, Agent, or Firm* — Slater Matsil, LLP

(57) ABSTRACT

An optoelectronic component and a method for producing an optoelectronic component are disclosed. In an embodiment a method includes attaching a plurality of optoelectronic semiconductor chips on predetermined locations of an intermediate film, providing a cavity film with a plurality of separated openings, attaching the cavity film to the intermediate film such that each optoelectronic semiconductor chip is associated with a respective opening, wherein the cavity film is thicker than the optoelectronic semiconductor chips such that the cavity film exceeds the optoelectronic semiconductor chips in a direction away from the intermediate film, filling a casting material in each of the openings such that the optoelectronic semiconductor chips are casted with the casting material and removing the intermediate film.

18 Claims, 7 Drawing Sheets

(51) Int. Cl.
  *H01L 33/50* (2010.01)
  *H01L 33/54* (2010.01)
  *H01L 33/62* (2010.01)
(52) U.S. Cl.
  CPC ............ *H01L 33/508* (2013.01); *H01L 33/54* (2013.01); *H01L 33/62* (2013.01); *H01L 2221/68368* (2013.01); *H01L 2933/005* (2013.01)
(58) Field of Classification Search
  CPC ........... H01L 33/62; H01L 2221/68368; H01L 2933/005; H01L 33/483–486; H01L 31/0203–02168; H01L 25/041–043; H01L 25/075–0756
  See application file for complete search history.

(56) References Cited

U.S. PATENT DOCUMENTS

| | | |
|---|---|---|
| 2015/0255313 A1 | 9/2015 | Brandl et al. |
| 2016/0079211 A1* | 3/2016 | Konishi ............. H01L 25/0753 438/27 |
| 2017/0098743 A1 | 4/2017 | Chen et al. |
| 2017/0301835 A1 | 10/2017 | Singer et al. |

OTHER PUBLICATIONS

"DuPont Thermx LG431-9733L White Liquid Crystal Polymer (Unverified Data**)," MatWeb, Material Property Data, downloaded from http://www.matweb.com/search/datasheetText.aspx?bassnum=PEA415 on Apr. 5, 2017, 2 pages.

"Featured Product—3M Silicone Laminating Adhesive Tapes," TEKRA a division of EIS, Inc., downloaded from http://www.tekra.com/resources/featured-product/featured-product-3m on Apr. 5, 2017, 4 pages.

"Mylar A," DuPont Teijin Films, downloaded from http://69.67.54.76/FilmEnterprise/Datasheet.asp?ID=302&Version=US on Apr. 13, 2017, 3 pages.

"Outperforms standard polyamides in heat, moisture and chemical resistance," Amodel PPA polyphthalamide, downloaded from http://www.solvay.com/en/markets-and-products/featured-products/am on Apr. 5, 2017, 3 pages.

"Polyethylene terephthalate," downloaded from Wikipedia, the free encyclopedia, https://en.wikipedia.org/wiki/Polyethylene_terephthalate on Apr. 5, 2017, 16 pages.

"Polyphthalamide," from Wikipedia, the free encyclopedia, downloaded from https://en.wikipedia.org/wiki/Polyphthalamide on Apr. 5, 2017, 4 pages.

* cited by examiner

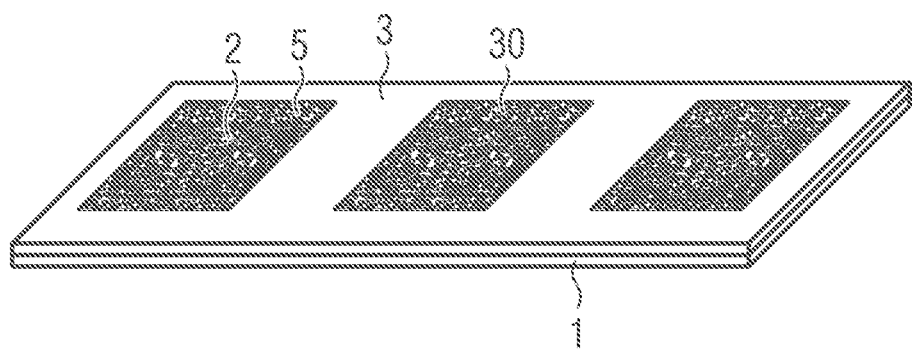
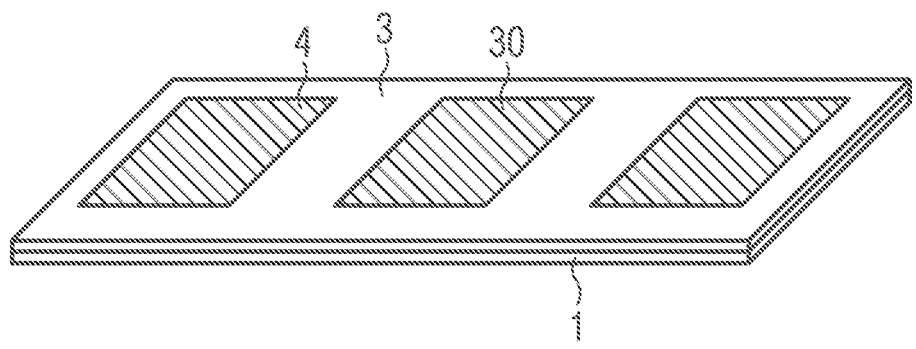

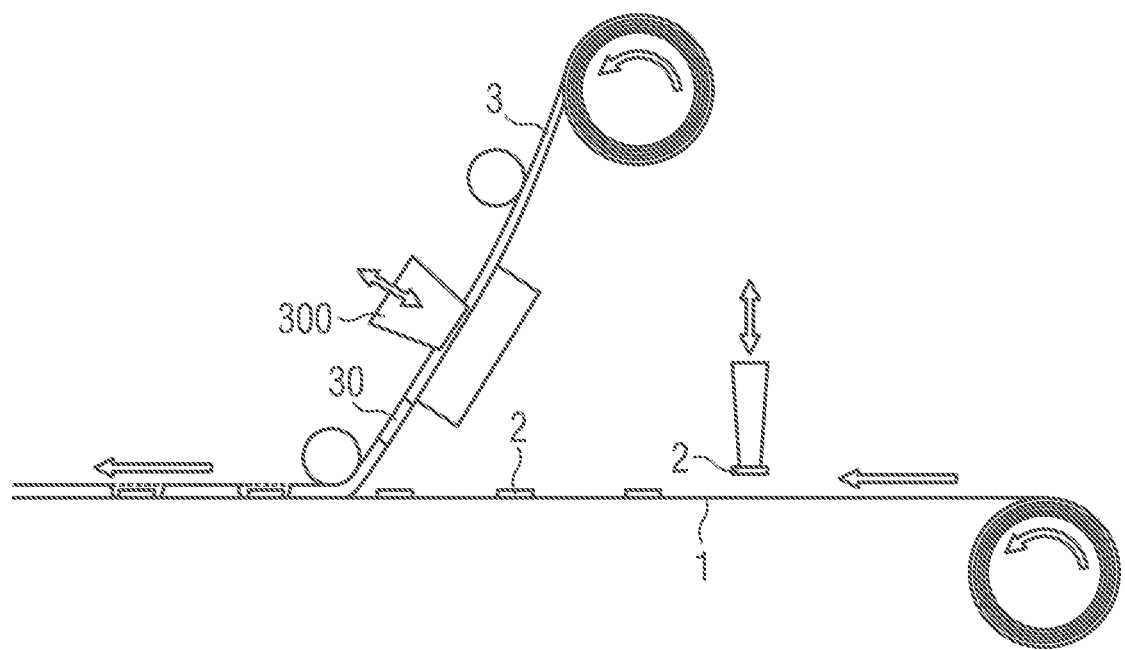

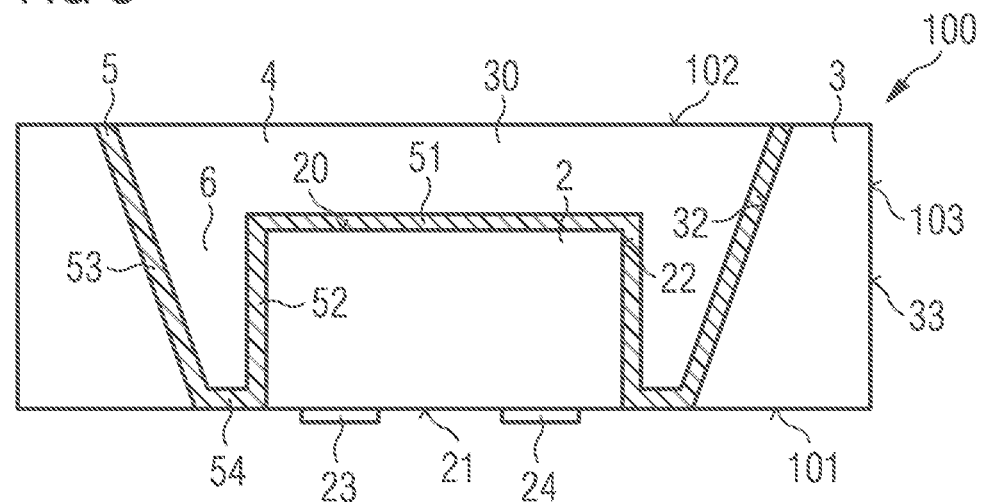
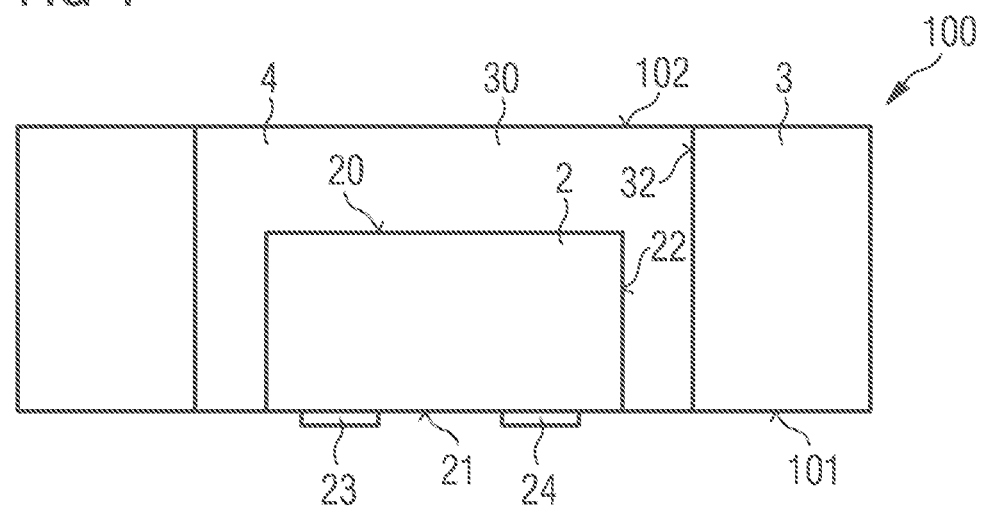

METHOD FOR PRODUCING AN OPTOELECTRONIC COMPONENT AND OPTOELECTRONIC COMPONENT

This patent application is a national phase filing under section 371 of PCT/EP2017/066950, filed Jul. 6, 2017 which is incorporated herein by reference in its entirety.

TECHNICAL FIELD

A method for producing an optoelectronic component is provided. Furthermore, an optoelectronic component is provided.

SUMMARY OF THE INVENTION

Embodiments provide an efficient method for producing an optoelectronic component. Further embodiments provide an optoelectronic component, which can be produced with this method.

According to at least one embodiment the method for producing an optoelectronic component comprises a step A), in which an intermediate film is provided. The intermediate film might be a tape, preferably an adhesive tape. In particular, the intermediate film is flexible or bendable or foldable or rollable. For this purpose, the intermediate film might have a thickness of at most 1 mm or at most 500 µm or at most 200 µm or at most 100 µm. Moreover, the intermediate film is preferably self-supporting. For this purpose, the intermediate film might have a thickness of at least 20 µm or at least 50 µm or at least 100 µm or at least 200 µm.

The intermediate film has a main extension direction. A top side of the intermediate film, extending along the main extension direction, may be adhesive. A bottom side of the intermediate film, extending basically parallel to the top side, might be adhesive as well. The thickness is measured between the top side and the bottom side. The intermediate film is preferably contiguous and without holes and interruptions. The intermediate film might be formed of one piece or might be formed in a multi-layer fashion.

According to at least one embodiment the method comprises a step B), in which a plurality of optoelectronic semiconductor chips is attached on predetermined locations of the intermediate film. In particular, the optoelectronic semiconductor chips are placed on the top side of the intermediate film. By attaching the optoelectronic semiconductor chips to the intermediate film, the semiconductor chips are preferably temporarily fixed to the intermediate film, for example, they are temporarily adhered to the intermediate film. Particularly, the optoelectronic semiconductor chips are brought into direct contact with the intermediate film.

The predetermined locations of the intermediate film might be locations with equal distances to each other. For example, the optoelectronic semiconductor chips are attached to the intermediate film in one single line or in a row or in a plurality of rows, like in a matrix.

Each optoelectronic semiconductor chip comprises an active layer, which produces electromagnetic radiation during the intended operation. For example, the active layer produces light in the blue or green or red color spectrum or in the UV region. The optoelectronic semiconductor chips may be AlInGaN semiconductor chips.

Each optoelectronic semiconductor chip comprises a top side and a bottom side, wherein the top side and the bottom side are main extension sides of the optoelectronic semiconductor chip, running basically parallel to each other. The top side may be a radiation exit side of the optoelectronic semiconductor chip via which at least 50% or at least 80% of the produced radiation is emitted. The bottom side may be a contact side of the optoelectronic semiconductor chip, via which the optoelectronic semiconductor chip can be electrically connected. The optoelectronic semiconductor chips may be surfaces-mountable chips, like flip-chips. The thickness of the optoelectronic semiconductor chips, measured between the top side and the bottom side is, for example, at most 250 µm or at most 200 µm or at most 150 µm. Additionally or alternatively, the thickness might be at least 80 µm or at least 100 µm.

In particular, each optoelectronic semiconductor chip comprises exactly one contiguous active layer. The lateral extent of each optoelectronic semiconductor chip, measured parallel to the top side or the bottom side of the semiconductor chip, corresponds basically to the lateral extent of the active layer. For example, the lateral extent of each optoelectronic semiconductor chip exceeds the lateral extent of the active layer by at most 10% or at most 5% or at most 1%.

When attaching the optoelectronic semiconductor chips to the intermediate film, the bottom sides of the semiconductor chips are preferably attached to the top side of the intermediate film. Thus, after attaching the semiconductor chips, the bottom sides of the semiconductor chips face towards the intermediate film, whereas the top sides face away from the intermediate film.

According to at least one embodiment the method comprises a step C), in which a cavity film with a plurality of separated openings is provided. The cavity film is preferably flexible or bendable or foldable or rollable. Moreover, the cavity film is preferably self-supporting. Particularly, the cavity film is an individual component, which is self-supporting before being attached to the intermediate film. For this purpose, the cavity film is made of a solid material and might have a thickness of at most 1 mm or at most 500 µm or most 200 µm or most 100 µm or at most 50 µm. Alternatively or additionally the cavity film might have a thickness of at least 20 µm or at least 30 µm at least 50 µm. For example, the cavity film is a tape, particularly an adhesive tape. Moreover, the cavity film already comprises the openings before being attached to the intermediate film.

The cavity film comprises a top side and a bottom side, which basically run parallel to each other. The top side and the bottom side are main extension sides of the cavity film. The top side and/or the bottom side may be adhesive. The thickness of the cavity film is measured from the top side to the bottom side. The cavity film is, for example, formed from one piece or is formed in a multilayer-fashion.

Each opening in the cavity film penetrates the cavity film completely. This means that the openings extend from the top side to the bottom side. In a lateral direction, parallel to the main extension direction of the cavity film, each opening is preferably completely surrounded by the material of the cavity film. In other words, the openings are holes or breakthroughs or cutouts in the cavity film. In a top view, on top of the top side of the cavity film, each opening is preferably completely surrounded by a contiguous rail of the material of the cavity film. The cavity film is preferably contiguous. For example, the cavity film comprises at least 10 opening or at least 100 openings.

According to at least one embodiment the method comprises a step D), in which the cavity film is attached to the intermediate film such that each semiconductor chip is associated with a respective opening, preferably with exactly one perspective opening. Particularly, the bottom side of the cavity film is applied to the top side of the intermediate film. The cavity film is preferably adhered to the intermediate film, for example, with the same adhesive that glues the semiconductor chips to the intermediate film.

After attaching the cavity film to the intermediate film, each semiconductor chip is located inside one opening of the cavity film. For example, at least 90% or at least 95% of the volume of each optoelectronic semiconductor chip is located inside the respective opening. In particular, each semiconductor chip is associated with one opening on a one-to-one basis. This means, exactly one semiconductor chip is located in each opening.

According to at least one embodiment the cavity film is thicker than the optoelectronic semiconductor chips such that the cavity film exceeds the optoelectronic semiconductor chips in a direction away from the intermediate film. For example, the cavity film is at least 20% or at least 50% or at least 100% or at least 150% or at least 200% thicker than the optoelectronic semiconductor chips. After attaching the cavity film to the intermediate film, the cavity film exceeds semiconductor chips, for example, by at least 20 µm or at least 50 µm or at least 100 µm or at least 200 µm.

The lateral extent of the openings is preferably larger than the lateral extent of the semiconductor chips such that the semiconductor chips completely fit into the openings. Particularly, in a top view, on top of the top side of the cavity film, the area of each opening is at least 1% or at least 5% or at least 10% larger than the area of the respective optoelectronic semiconductor chip in this top view. Additionally or alternatively, the area of the openings in this top view is at most 15% or at most 10% or most 7% larger than the area of the respective optoelectronic semiconductor chips.

According to at least one embodiment the method comprises a step E), in which a casting material is filled in each of the openings such that the semiconductor chips are casted with the casting material. The casting material preferably mechanically connects the semiconductor chips with the cavity film. The casting material may be transparent or translucent to the radiation emitted by the semiconductor chips. The casting material might comprise converter particles for converting the radiation emitted by the semiconductor chips.

The casting material preferably covers the top side of the semiconductor chips as well as side surfaces of the semiconductor chips. For example, the casting material is filled into the openings in such a way that the casting material terminates flush with the top side of the cavity film. Alternatively, the casting material might exceed the top side of the cavity film.

The casting material might be a silicone, like clear silicone, or an epoxy or a resin. The casting material is preferably filled in in a liquid or viscous phase and is cured afterwards. After curing the casting material, the casting material preferably stays cured for the intended operation temperatures of the optoelectronic semiconductor chips. The cured casting material preferably provides the mechanically stable connection of the optoelectronic semiconductor chips to the cavity film.

According to at least one embodiment the method comprises a step F), in which the intermediate film is removed. The intermediate film is removed without destroying the optoelectronic semiconductor chips or the connection between the optoelectronic semiconductor chips and the cavity film. After removing the intermediate film, the optoelectronic semiconductor chips remain inside the openings of the cavity film and are mechanically stably connected to the cavity film via the casting material. Preferably, the intermediate film is removed without being destroyed.

According to at least one embodiment, the steps B), D), E) and F) are applied one after another in the claimed order.

According to at least one embodiment the method for producing an optoelectronic component comprises a step A), in which an intermediate film is provided. In a step B) a plurality of optoelectronic semiconductor chips is attached onto predetermined locations of the intermediate film. In a step C) a cavity film with a plurality of separated openings is provided. In a step D) the cavity film is attached to the intermediate film such that each optoelectronic semiconductor chip is associated with a respective opening. The cavity film is thicker than the optoelectronic semiconductor chips such that the cavity film exceeds the optoelectronic semiconductor chips in a direction away from the intermediate film. In a step E) a casting material is filled in each of the openings such that the optoelectronic semiconductor chips are casted with the casting material. In a step F) the intermediate film is removed.

By using an intermediate film and a cavity film with openings, optoelectronic components in chip scale package design can be produced very efficiently. Existing process flows for producing optoelectronic components in chip scale package design usually comprise several process steps in which the chips are attached to different tapes, flipped and afterwards removed from the tapes. This makes these processes very lengthy and reduces the yield of produced components per time unit. The method of the present invention does not need steps in which the semiconductor chips are flipped or attached to several intermediate carriers. One intermediate film, which is removed afterwards, is sufficient. In this way an efficient fabrication method, with which a large number of produced components per time unit can be obtained, is provided.

According to at least one embodiment the intermediate film and the cavity film are each provided in the form of a reel. The intermediate film and/or the cavity film are, for example, provided as a tape, preferably as an adhesive tape, which is rolled up to a reel. For example, the intermediate film and/or the cavity film have a length in a main extension direction of at least 10 cm or at least 1 m or at least 10 m or at least 50 m.

According to at least one embodiment the cavity film is attached to the intermediate film in step D) in a reel-to-reel process, in which the intermediate film and the cavity film are unrolled simultaneously and connected to each other thereafter. For example, during the reel-to-reel process a part of the intermediate film and a part of the cavity film are unrolled from the respective reels, whereas other parts of the intermediate film and the cavity film are still rolled up to the reels. Preferably, the unrolled parts of the intermediate film and cavity film are attached to each other before the reel with the intermediate film and the reel with the cavity film are completely unrolled.

The intermediate film and/or the cavity film may be used as assembly lines or conveyor belts moving, for example, with a speed of at least 10 cm/s or at least 50 cm/s or at least 1 m/s. While the intermediate film is moving, the semiconductor chips are placed on it. Afterwards the cavity film is attached to the intermediate film. For this purpose, the cavity film preferably moves with the same speed as the intermediate film.

A reel-to-reel process allows producing a large number of optoelectronic components per time unit.

According to at least one embodiment the cavity film is patterned or structured with the openings after being unrolled and before being attached to the intermediate film. For example, while the cavity film is rolled up to the reel, the cavity film is free of openings. Only the parts of the cavity film, which are unrolled from the reel, are provided with openings. The patterning or structuring of the cavity film might be done with the help of embossing or imprinting, for example, via a stamp.

According to at least one embodiment before step E) and after step D) a phosphor layer designed for light conversion is attached to the optoelectronic semiconductor chips. The phosphor layer may be applied directly to the semiconductor chips. For example, the phosphor layer comprises organic or inorganic converter particles. The phosphor layer may have a thickness of the least 5 µm or at least 10 µm or at least 30 µm or at least 50 µm. Additionally or alternatively, the phosphor layer may have a thickness of at most 200 µm or at most 150 µm or at most 100 µm or at most 80 µm. Within the production tolerance, the phosphor layer preferably has a homogeneous thickness. The phosphor layer can, for example, be applied via evaporation or sputtering or lamination or spray coating.

The phosphor layer is designed in such a way that it converts the radiation emitted by the optoelectronic semiconductor chips partially or completely. The light coming out of the phosphor layer might be a mixture of converted radiation and unconverted primary radiation and might mix up to white light.

An individual phosphor layer may be provided for each opening or each semiconductor chip, respectively. Each phosphor layer preferably only covers the region within the opening. The regions of the cavity film outside the openings are preferably not covered with the phosphor layers.

According to at least one embodiment the cavity film is cut or singulated in the area in-between neighboring openings after step F). In this way a plurality of optoelectronic components is obtained, wherein each optoelectronic component comprises one, preferably exactly one, optoelectronic semiconductor chip. Said optoelectronic semiconductor chip is laterally completely surrounded by a housing body, which is formed from the cavity film.

The obtained optoelectronic components have preferably a chip scale package design. This means that the size, especially the lateral extent, of each optoelectronic component is defined by the size, especially the lateral extent, of the optoelectronic semiconductor chip. For example, at least 50% or at least 70% or at least 80% of the volume of each optoelectronic component is formed by the optoelectronic semiconductor chip. A bottom side of each optoelectronic component might be formed to at least 50% or to at least 70% or at least 80% by the bottom side of the optoelectronic semiconductor chip.

According to at least one embodiment, the intermediate film is provided as a thermal release film or a thermal release tape. A thermal release film is adhesive at a certain temperature, for example, at room temperature, and loses its adhesive properties when heated up above a certain temperature, for example, above 50° C. In step F) the intermediate film can be heated up such that the semiconductor chips and the cavity film can be easily removed from the intermediate film.

According to at least one embodiment the casting material is cured after step E) and before step F) such that the casting material mechanically fixes the semiconductor chips inside the openings and mechanically connects the semiconductor chips to the cavity film. Particularly, after removing the intermediate film, the semiconductor chips are mechanically stably connected to the cavity film via the casting material.

According to at least one embodiment the casting material is a transparent material, which is transparent to the radiation emitted by the semiconductor chips and/or to the radiation to which the phosphor layer converts the radiation of the semiconductor chips.

According to at least one embodiment the cavity film and/or the intermediate film comprise or are formed of a plastic material, like a polyimide, preferably a white polyimide, or a liquid crystal polymer, like a white or black liquid crystal polymer, or polyphthalamide or polyethylene terephthalate. In particular, the cavity film and/or the intermediate film may comprise a plastic layer of one these materials and one or more adhesive layers, for example, of silicone or acryl.

According to at least one embodiment the intermediate film is a tape on which the semiconductor chips are attached in one row only. For example, the openings in the cavity film are arranged in a single line. For example, the intermediate film has a width which matches with the widths of the finalized optoelectronic components. The cavity film might also have a width which matches with the width of the finalized optoelectronic components. The lengths of the intermediate film and/or of the cavity film are, for example, by a factor of at least 100 or at least 10000 or at least 1000000, larger than the widths of the intermediate film and/or the cavity film.

Furthermore, an optoelectronic component is provided. For example, said optoelectronic component is produced with the method according to the embodiments indicated above. Thus, features of the method are also disclosed for the optoelectronic component and vice versa.

According to at least one embodiment the optoelectronic component comprises an optoelectronic semiconductor chip with a top side, a bottom side lying opposite to the top side, and a side surface connecting the top side to the bottom side. The top side and the bottom side preferably form main extension sides of the optoelectronic semiconductor chip.

According to at least one embodiment the optoelectronic component comprises a housing body with an opening. Said opening completely penetrates the housing body. The housing body also comprises a top side and a bottom side opposite to the top side. The top side and the bottom side form main extension sides of the housing body as well. The opening penetrates the housing body from the top side to the bottom side.

According to at least one embodiment the optoelectronic semiconductor chip is located inside the opening. Preferably, the top sides and bottom sides of the housing body and of the optoelectronic semiconductor chip run basically parallel to each other.

According to at least one embodiment the bottom side of the optoelectronic semiconductor chip forms a part of a bottom side of the optoelectronic component. In other words, the bottom side of the optoelectronic semiconductor chip is freely accessible and exposed at the bottom side of the optoelectronic component. A further part of the bottom side of the optoelectronic component might be formed by the bottom side of the housing body.

According to at least one embodiment the housing body exceeds the optoelectronic semiconductor chip at the top side of the optoelectronic semiconductor chip. This means that the housing body is thicker than the optoelectronic semiconductor chip.

According to at least one embodiment the housing body completely surrounds the optoelectronic semiconductor chip in a lateral direction. The lateral direction is a direction parallel to the bottom side of the optoelectronic component and/or of the optoelectronic semiconductor chip and/or of the housing body. The housing body is, for example, made from one piece. In a top view, on top of the top side of the optoelectronic semiconductor chip, the optoelectronic semiconductor chip is preferably completely surrounded by a contiguous rail of the material of the housing body. Furthermore, the semiconductor chip is preferably spaced apart from the housing body in all lateral directions.

According to at least one embodiment the opening is bound by an inner side surface of the housing body. The inner side surface of the housing body forms an interface between the opening and the housing body. The inner side surface of the housing body runs crosswise, for example, perpendicular, to the bottom side of the optoelectronic component.

According to at least one embodiment the inner side surface of housing body faces the side surface of the optoelectronic semiconductor chip. The side surface of the optoelectronic semiconductor chip and the inner side surface of the housing body may run basically parallel to each other. The side surface of the optoelectronic semiconductor chip and the inner side surface of the housing body are preferably spaced apart from each other.

According to at least one embodiment the housing body is made of a plastic material, for example, of a polyimide, preferably a white polyimide, or a liquid crystal polymer, like a white or black liquid crystal polymer, or polyphthalamide or polyethylene terephthalate.

According to at least on embodiment a side surface of the optoelectronic component is partially or completely formed by an outer side surface of the housing body and shows traces of material removal. The side surface of the optoelectronic component runs crosswise, preferably perpendicular, to the bottom side of the optoelectronic component. It connects a top side of the optoelectronic component to the bottom side of the optoelectronic component. The side surface, the top side and the bottom side of the optoelectronic component preferably form outer surfaces of the optoelectronic component.

The traces of material removal might be traces of physical or chemical material removal. They result, for example, from the singulation process.

According to at least one embodiment the optoelectronic component further comprises a phosphor layer for converting radiation emitted by the optoelectronic semiconductor chip.

According to at least one embodiment a first part of the phosphor layer covers the top side of the semiconductor chip, a second part of the phosphor layer covers the side surface of the optoelectronic semiconductor chip and a third part of the phosphor layer covers the inner side surface of the housing body. Preferably, the phosphor layer is a contiguous layer, particularly preferably a contiguous layer without holes or interruptions. The phosphor layer may cover the top side and the side surface of the optoelectronic semiconductor chip and the inner side surface of the housing body completely.

The first part and the second part of the phosphor layer may be in direct contact with the optoelectronic semiconductor chip. The third part of the phosphor layer may be in direct contact with the inner side surface of the housing body.

According to at least one embodiment a gap or a trench separates the second part and the third part of the phosphor layer from each other in the lateral direction. For example, some of the light, which exits the optoelectronic semiconductor chip at its side surface during its intended operation, travels through the first part of the phosphor layer, then exits the phosphor layer and travels through the gap, and afterwards the light reenters into the phosphor layer in the region of the third part. The distance between the second part and the third part of the phosphor layer might be at least 1% of the lateral extent of the optoelectronic semiconductor chip.

According to at least one embodiment a transparent casting material is filled into the opening such that the top side of the optoelectronic semiconductor chip is covered by the casting material. The casting material can be in direct contact with the first part of the phosphor layer.

According to at least one embodiment the gap between the second part and the third part of the phosphor layer is filled up with the casting material. For example, the casting material is in direct contact with the phosphor layer in the region of the second part and the third part. Preferably, the gap or the trench between the second part and the third part of the phosphor layer is completely filled up with the casting material.

According to at least one embodiment a fourth part of the phosphor layer connects the second part and the third part of the phosphor layer. The fourth part of the phosphor layer preferably forms a part of the bottom side of the optoelectronic component. The fourth part of the phosphor layer may be exposed and freely accessible at the bottom side of the optoelectronic component.

According to at least one embodiment the optoelectronic component is a surface-mountable optoelectronic component. For example, all electric contact elements necessary for electrically connecting the optoelectronic component are provided at the bottom side of the optoelectronic component. In an unmounted configuration, the bottom side of the optoelectronic component is exposed and freely accessible.

According to at least one embodiment the bottom side of the optoelectronic semiconductor chip comprises two contact elements for electrically contacting the optoelectronic semiconductor chip. The contact elements of the optoelectronic semiconductor chip can be identical to the contact elements of the optoelectronic component.

According to at least one embodiment the diameter of the opening of the housing body decreases in the direction towards the bottom side of the optoelectronic component. For example, the opening has the form of a truncated pyramid or a truncated cone. The diameter of the opening in the region of the top side of the optoelectronic component might be at least 50% or at least 100% larger than the diameter of the opening at the bottom side of the optoelectronic component. For example, the inner side surface of the housing body and the bottom side of the optoelectronic component form an angle of at most 70° or at most 60°.

BRIEF DESCRIPTION OF THE DRAWINGS

Hereinafter, a method for producing an optoelectronic component as well as an optoelectronic component described herein are described with reference to the drawings by means of exemplary embodiments. Here, like reference numerals indicate like elements in the figures. However, the size ratios involved are not to scale, individual elements may rather be illustrated with an exaggerated size for a better understanding.

As shown in:

FIGS. 1A to 1J and FIG. 2 show different positions in an exemplary embodiment of the method for producing an optoelectronic component; and FIGS. 3 and 4 show exemplary embodiments of the optoelectronic component.

DETAILED DESCRIPTION OF ILLUSTRATIVE EMBODIMENTS

Figure 1A:
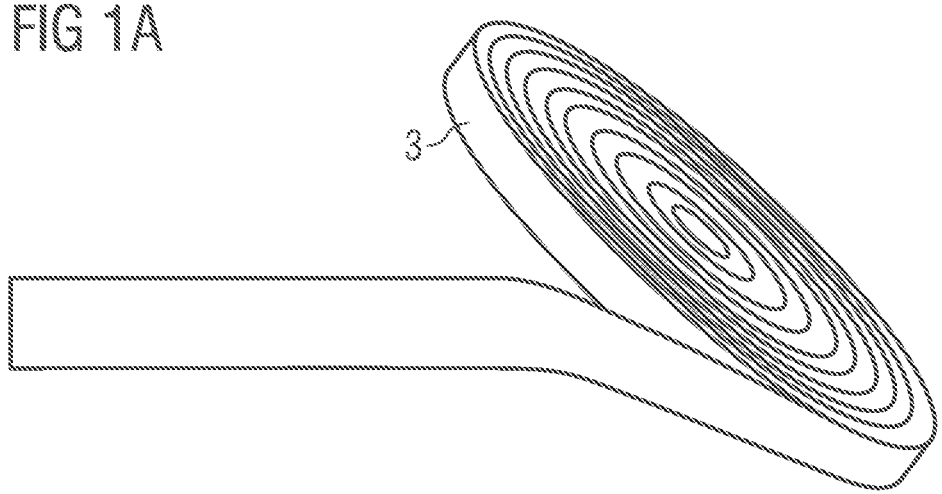

FIG. 1A shows a first position in an exemplary embodiment of the method for producing an optoelectronic component. A cavity film 3 is provided in the form of a reel. The cavity film 3 is, for example, a tape, in particular an adhesive tape. The cavity film 3 is flexible and bendable. For example, the thickness of the cavity film 3 is at most 200 µm.

A first part of the cavity film 3 is unrolled, wherein the rest of the cavity film 3 is still rolled up to the reel. The cavity film 3 is, for example, made of a polyimide, in particular a white polyimide.

Figure 1B:
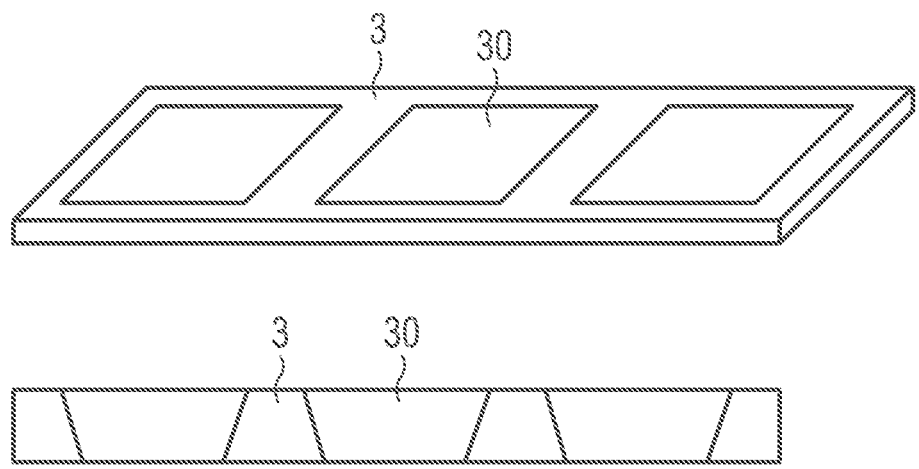

In the position of FIG. 1B the unrolled part of the cavity film 3 is patterned with a plurality of openings 30. The openings 30 are applied in one row or one line and at equal distances. The openings 30 penetrate the cavity film 3 completely from a top side of the cavity film 3 to a bottom side of the cavity film 3. The top side and the bottom side of the cavity film 3 are main extension sides of the cavity film 3. A length of the cavity film 3 is much larger than a width of the cavity film 3. For example, the width of the cavity film 3 is at most 1 mm or at most 500 µm, wherein the length of cavity film 3 is in the region of centimeters or meters.

As also visible in FIG. 1B, the openings 30 have a diameter which decreases in direction from the top side of the cavity film 3 towards the bottom side of the cavity film 3.

Figure 1C:
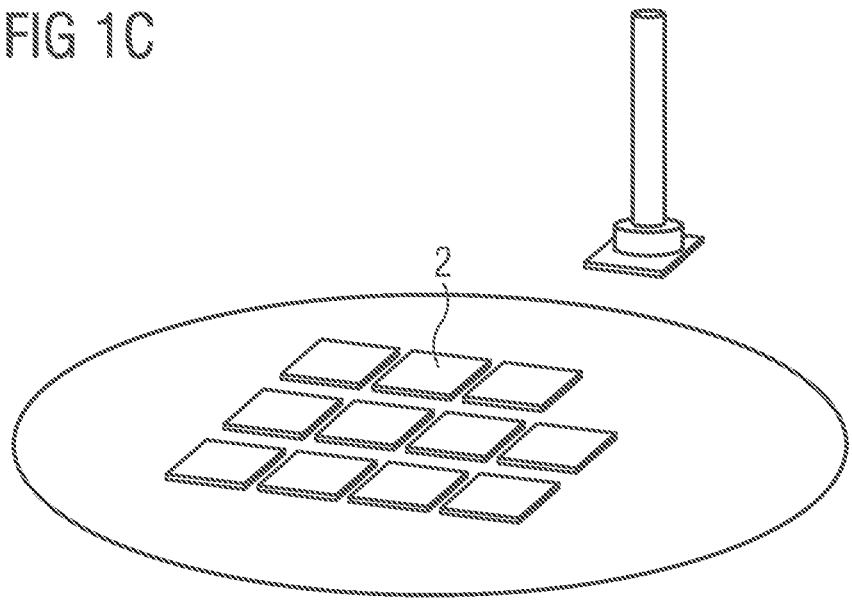

FIG. 1C shows a further position in the method where a plurality of optoelectronic semiconductor chips 2 is provided. The optoelectronic semiconductor chips 2 are, for example, AlInGaN-based semiconductor chips which emit electromagnetic radiation in the blue or UV spectrum during their intended operation. The optoelectronic semiconductor chips 2 may be surface-mountable chips, like flip-chips.

For example, each of the optoelectronic semiconductor chips 2 has a lateral extent of at most 500 µm. The thickness of the optoelectronic semiconductor chips 2 is, for example, at most 250 µm and at least 100 µm.

Figure 1D:
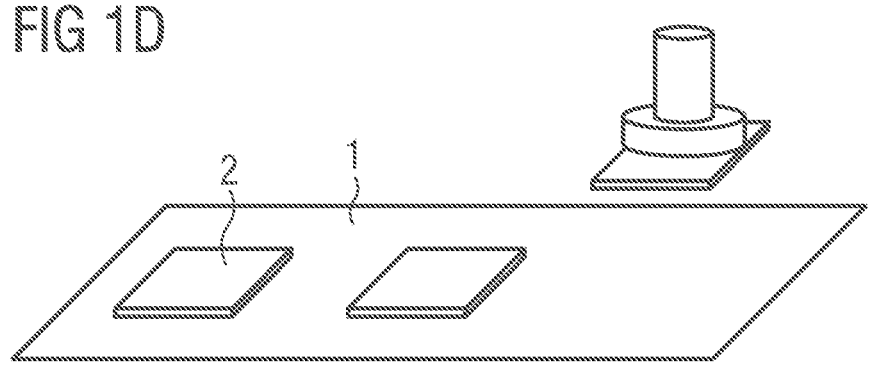

In the position of FIG. 1D the optoelectronic semiconductor chips 2 are attached to predetermined positions of an intermediate film 1. The intermediate film 1 is, for example, a thermal release film. The intermediate film 1 might be provided as a reel in the same way as the cavity film 3 (see FIG. 1A). The intermediate film 1 is a contiguous film without holes or interruptions.

Figure 1E:
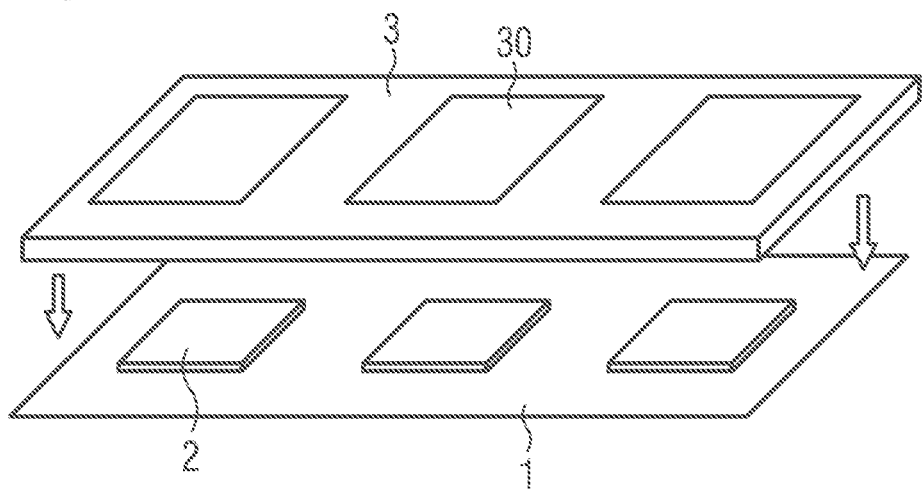

In the position of FIG. 1E the cavity film 3 is attached to the intermediate film 1 in a way such that each semiconductor chip 2 gets associated with a respective opening 30. For example, the cavity film 3 is fixed to the intermediate film 1 by using the thermal release properties of the intermediate film 1.

Figure 1F:
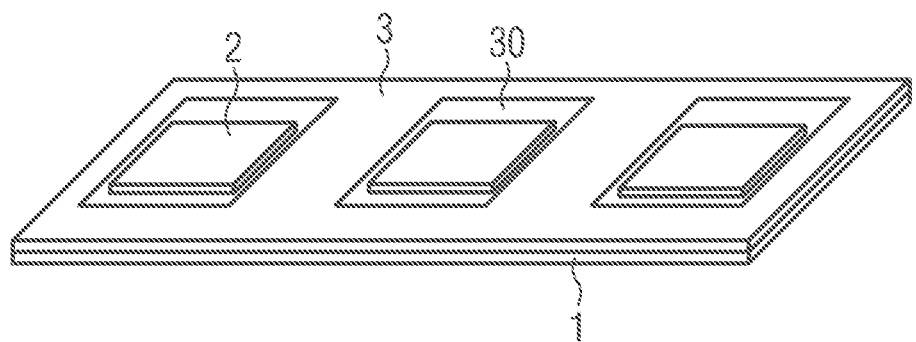

In the position of FIG. 1F the cavity film 3 is finally fixed, for example, adhered, to the intermediate film 1. Each optoelectronic semiconductor chip 2 is located inside a respective opening 30, which is associated with the optoelectronic semiconductor chip 2 on a one-to-one basis. In particular, the lateral extents of the openings 30 are larger than the lateral extents of the optoelectronic semiconductor chips 2 such that each optoelectronic semiconductor chip 2 completely fits into the associated opening 30.

In the position of FIG. 1G a phosphor layer 5 is applied to the optoelectronic semiconductor chips 2. For example, an individual phosphor layer 5 is provided for each optoelectronic semiconductor chip 2. The phosphor layers 5 are designed for converting the radiation emitted by the optoelectronic semiconductor chips 2.

In the position of FIG. 1H, the optoelectronic semiconductor chips 2 with the applied phosphor layer 5 are additionally covered with a casting material 4, in particular with a transparent casting material 4. The casting material 4 might be a silicone or a resin or an epoxy. The casting material 4, for example, fills up all the rest of the openings 30, which are not filled with optoelectronic semiconductor chips 2 and the phosphor layer 5. For example, the casting material 4 exceeds the top side of the cavity film 3.

After filling in the casting material 4, the casting material 4 is cured. In this way, the optoelectronic semiconductor chips 2 are mechanically and permanently connected to the cavity film 3.

Figure 1I:
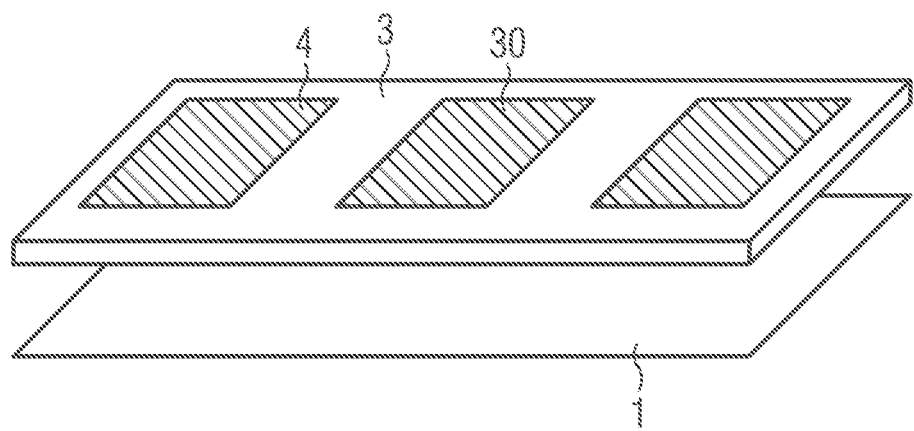

In FIG. 1I a position of the method is shown in which the intermediate film 1 is removed from the cavity film 3. For this purpose, the intermediate film 1 is, for example, heated up such that the sticking connection between the cavity film 3 and/or the optoelectronic semiconductor chips 2 to the intermediate film 1 is released. The removal of the intermediate film 1 is possible without destroying the permanent connection between the optoelectronic semiconductor chips 2 and the cavity film 3.

Figure 1J:
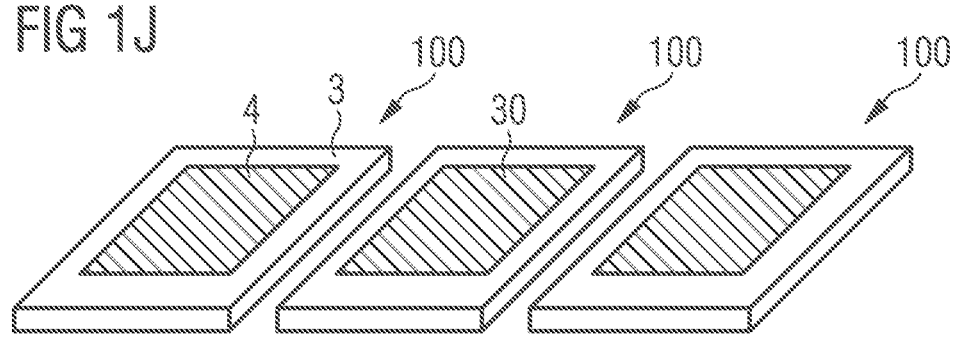

In FIG. 1J a position of the method is shown in which the cavity film 3 with the optoelectronic semiconductor chips 2 is singulated or cut into individual optoelectronic components 100. For this purpose, the cavity film 3 was cut in the areas in between neighboring openings 30. Each of the obtained optoelectronic components 100 comprises exactly one optoelectronic semiconductor chip 2, which is surrounded by a housing body 3, made of a part of the cavity film 3. The housing body 3 forms a frame around the respective optoelectronic semiconductor chip 2.

In FIG. 2 an exemplified embodiment of the method is indicated with which the optoelectronic components 100 can be produced very quickly and efficiently in a large number. The method is based on a reel-to-reel process. For this purpose, the cavity film 3 and the intermediate film 1 are used as assembly lines. A reel of the cavity film 3 and a reel of the intermediate film 1 are provided which are simultaneously unrolled. The unrolled parts of the cavity film 3 and of the intermediate film 1 move with the same velocity of, for example, at least 10 cm/s.

Before the cavity film 3 is attached to the intermediate film 1, the optoelectronic semiconductor chips 2 are positioned and attached on the unrolled parts of the intermediate film 1 at equal distances.

Furthermore, before attaching the cavity film 3 to the intermediate film 1, the cavity film 3 is patterned with a number of openings 30. For this purpose, the cavity film 3 is embossed with the help of a stamp 300. The openings 30 are preferably provided at the same distances at which the optoelectronic semiconductor chips 2 are attached to the intermediate film 1.

Afterwards, the cavity film 3 is attached, for example, adhered, to the intermediate film 1. The speed of the intermediate film 1 and the cavity film 3 as well as the positions of the optoelectronic semiconductor chips 2 and of the openings 30 are synchronized and adapted in such a way that during the attachment of the cavity film 3 to the intermediate film 1 each optoelectronic semiconductor chip 2 is placed inside a respective opening 30 of the cavity film 3.

Afterwards the optoelectronic semiconductor chips 2 can be covered with the phosphor layer 5 and the casting material 4 (not shown). After curing the casting material 4, the intermediate film 1 is released and the cavity film 3 is singulated or cut in the areas in between neighboring openings 30 (not shown).

In FIG. 3 an exemplified embodiment of an optoelectronic component 100 is shown. The optoelectronic component 100 comprises an optoelectronic semiconductor chip 2, placed inside an opening 30 of a housing body 3. The housing body 3 is, for example, made of a white polyimide.

The optoelectronic component 100 comprises a top side 102 and a bottom side 101, which are main extension sides of the optoelectronic component 100. A side surface 103 of the optoelectronic component 100 runs perpendicular to the top side 102 and the bottom side 101 and connects the top side 102 and the bottom side 101.

The side surface 103 of the optoelectronic component 100 is formed by an outer side surface 33 of the housing body 3 and shows traces of material removal. The bottom side 101 of the optoelectronic component 100 is partially formed by a bottom side of the housing body 3 and partially by a bottom side 21 of the optoelectronic semiconductor chip 2. At the bottom side 101 of the optoelectronic component 100 the bottom side 21 of the optoelectronic semiconductor chip 2 and the bottom side of the housing body 3 terminate flush with each other and are exposed.

The top side 102 of the optoelectronic component 100 is partially formed from a top side of the housing body 3. The opening 30 penetrates the housing body 3 completely from the top side 102 of the optoelectronic component 100 to the bottom side 101 of the optoelectronic component 100. The diameter or lateral extent of the opening 30 decreases from the top side 102 of the optoelectronic component 100 towards the bottom side 101 of the optoelectronic component 100.

The housing body 3 and the optoelectronic component 100 have larger thicknesses than the optoelectronic semiconductor chip 2. The thicknesses are measured from the top sides to the bottom sides, respectively. The top side of housing body 3 exceeds the top side 20 of the optoelectronic semiconductor chip 2, for example, by at least 50 µm.

The optoelectronic semiconductor chip 2 fits completely into the opening 30 of the housing body 3. In a lateral direction, parallel to the bottom side 101 of the optoelectronic component 100, the housing body 3 completely surrounds the optoelectronic semiconductor chip 2. The housing body 3 is particularly formed from one single piece.

The optoelectronic semiconductor chip 2 comprises a side surface 22, which connects the top side 20 of the optoelectronic semiconductor chip 2 and the bottom side 21 of the optoelectronic semiconductor chip 2. The opening 30 in the housing body 3 is bound by an inner side surface 32 of the housing body 3. The inner side surface 32 of the housing body 3 forms the interface between the opening 30 and the housing body 3. The inner side surface 32 of the housing body 3 faces the side surface 22 of the semiconductor chip 2.

The optoelectronic component 100 of FIG. 3 further comprises a contiguous phosphor layer 5 without holes or interruptions. The phosphor layer 5 is designed for converting radiation emitted by the optoelectronic semiconductor chip 2. The phosphor layer 5, for example, has a thickness of at least 30 µm and at most 100 µm and covers the optoelectronic semiconductor chip 2 as well as the housing body 3. A first part 51 of the phosphor layer 5 covers the top side 20 of the optoelectronic semiconductor chip 2 completely. A second part 52 of the phosphor layer 5 completely covers the side surface 22 of the optoelectronic semiconductor chip 2. A third part 53 of the phosphor layer 3 covers the inner side surface 32 of the housing body 3.

The third part 53 of the phosphor layer 5 and the second part 52 of the phosphor layer 5 are connected to each other by a fourth part 54 of the phosphor layer 5. The fourth part 54 of the phosphor layer 5 forms a part of the bottom side 101 of the optoelectronic component 100. In an unmounted configuration of the optoelectronic component 100, the fourth part 54 of the phosphor layer 5 is, for example, exposed at the bottom side 101 of the optoelectronic component 100.

In between the second part 52 of the phosphor layer 5 and the third part 53 of the phosphor layer 5 a gap 6 or a trench 6 is formed, which separates the first part 52 and the third part 53 of the phosphor layer 5 from each other in the lateral direction. The gap 6, as well as the rest of the opening 30, is completely filled up with a casting material 4, which is, for example, a transparent silicone. At the top side 102 of the optoelectronic component 100, the casting material 4 terminates flush with the top side of the housing body 3. However, it is also possible that the casting material 4 exceeds the top side of the housing body 3 at the top side 102 of the optoelectronic component 100.

The optoelectronic component 100 of FIG. 3 is a surface-mountable component. All electrical contacts which are necessary for electrically connecting the optoelectronic component 100 are located at the bottom side 101 of the optoelectronic component 100. In particular, the optoelectronic semiconductor chip 2 is a surface-mountable semiconductor chip with two contact elements 23, 24 at the bottom side 21 for electrically connecting the optoelectronic semiconductor chip 2. The bottom side 21 of the optoelectronic semiconductor chip 2 is exposed at the bottom side 101 of the optoelectronic component 100 in the area of the opening 30. In this way, the contact elements 23, 24 of the optoelectronic semiconductor chip 2 are exposed at the bottom side 101 of the optoelectronic component 100. The contact elements 23, 24 of the optoelectronic semiconductor chip 2 also serve as contact elements for the optoelectronic component 100.

Moreover, the optoelectronic component 100 of FIG. 3 has a so-called chip scale package design. This means that the size and the volume of the whole optoelectronic component 100 is basically determined by the size and the volume of the optoelectronic semiconductor chip 2.

In FIG. 4 a further exemplified embodiment of an optoelectronic component 100 is shown. In principle, the optoelectronic component 100 of FIG. 4 is similar to the optoelectronic component 100 of FIG. 3. Especially, both optoelectronic components 100 can be produced with the methods described herein. In contrast to the optoelectronic component of FIG. 3, the optoelectronic component 100 of FIG. 4 does not have a phosphor layer 5. Instead, the casting material 4 is directly applied to the optoelectronic semiconductor chip 2. At the bottom side 101, in the area of the opening 30, a part of the casting material 4 is exposed. Moreover, the opening 30 has a constant diameter in the direction from the top side 100 to the bottom side 101 of the optoelectronic component 100.

The invention described herein is not limited by the description in conjunction with the exemplary embodiments. Rather, the invention comprises any new feature as well as any combination of features, particularly including any combination of features in the patent claims, even if said feature or said combination per se is not explicitly stated in the patent claims or exemplary embodiments.

The invention claimed is:

1. A method for producing an optoelectronic component, the method comprising:
    attaching a plurality of optoelectronic semiconductor chips on locations of an intermediate film;
    providing a cavity film with a plurality of separated openings;
    attaching the cavity film to the intermediate film such that each optoelectronic semiconductor chip is associated with a respective opening, wherein the cavity film is thicker than the optoelectronic semiconductor chips such that the cavity film exceeds the optoelectronic semiconductor chips in a direction away from the intermediate film;
    filling a casting material in each of the openings such that the optoelectronic semiconductor chips are casted with the casting material; and
    removing the intermediate film.

2. The method according to claim 1, wherein the intermediate film and the cavity film are each provided in form of a reel, wherein attaching the cavity film to the intermediate film comprises attaching the cavity film to the intermediate film in a reel-to-reel process in which the intermediate film and the cavity film are unrolled simultaneously and connected to each other thereafter.

3. The method according to claim 2, wherein the cavity film is patterned with the openings after being unrolled and before being attached to the intermediate film.

4. The method according to claim 1, further comprising, before filling the casting material in each opening and after attaching the cavity film to the intermediate film, attaching a phosphor layer designed for light conversion to the optoelectronic semiconductor chips.

5. The method according to claim 1, further comprising, after removing the intermediate film, singulating the cavity film in areas in between neighboring openings such that a plurality of optoelectronic components is obtained, each optoelectronic component comprising one optoelectronic semiconductor chip, wherein the optoelectronic semiconductor chip is laterally completely surrounded by a housing body formed from the cavity film.

6. The method according claim 1, wherein the intermediate film is a thermal release tape.

7. The method according to claim 1, further comprising curing the casting material after filling the casting material in each of the openings such that the casting material mechanically fixes the optoelectronic semiconductor chips inside the openings and mechanically connects the optoelectronic semiconductor chips to the cavity film.

8. The method according to claim 1, wherein the casting material is a transparent material.

9. The method according to claim 1, wherein the cavity film comprises a polyimide, a liquid crystal polymer, a polyphthalamide or a polyethylene terephthalate.

10. The method according to claim 1, wherein the intermediate film is a tape on which the semiconductor chips are attached in one row only.

11. An optoelectronic component comprising:
    an optoelectronic semiconductor chip with a top side, a bottom side opposite the top side, and a side surface connecting the top side and the bottom side;
    a phosphor layer configured to convert radiation emitted from the optoelectronic semiconductor chip; and
    a housing body with an opening, the opening completely penetrating through the housing body,
    wherein the optoelectronic semiconductor chip is located inside the opening,
    wherein the bottom side of the optoelectronic semiconductor chip forms a part of a bottom side of the optoelectronic component,
    wherein the housing body exceeds the optoelectronic semiconductor chip at its top side,
    wherein the housing body completely surrounds the optoelectronic semiconductor chip in a lateral direction,
    wherein the opening is bound by an inner side surface of the housing body in the lateral direction,
    wherein the inner side surface of the housing body faces the side surface of the optoelectronic semiconductor chip,
    wherein the housing body is made of a plastic material,
    wherein a side surface of the optoelectronic component is at least partially formed by an outer side surface of the housing body and shows traces of material removal,
    wherein a first part of the phosphor layer covers the top side of the optoelectronic semiconductor chip, wherein a second part of the phosphor layer covers the side surface of the optoelectronic semiconductor chip, wherein a third part of the phosphor layer covers the inner side surface of the housing body, and wherein a gap separates the second part and the third part of the phosphor layer from each other in the lateral direction.

12. The optoelectronic component according to claim 11, further comprising a transparent casting material filled into the opening such that the top side of the optoelectronic semiconductor chip is covered by the casting material and the gap between the second part and the third part of the phosphor layer is filled up with the casting material.

13. The optoelectronic component according to claim 11, wherein a fourth part of the phosphor layer connects the second part and the third part of the phosphor layer, and wherein the fourth part of the phosphor layer forms a part of the bottom side of the optoelectronic component.

14. The optoelectronic component according to claim 11, wherein the optoelectronic component is a surface-mountable optoelectronic component, and wherein the bottom side of the optoelectronic semiconductor chip comprises two contact elements for electrically connecting the optoelectronic semiconductor chip.

15. The optoelectronic component according to claim 11, wherein a diameter of the opening decreases in a direction towards the bottom side of the optoelectronic component.

16. An optoelectronic component comprising:
    an optoelectronic semiconductor chip with a top side, a bottom side opposite the top side, and a side surface connecting the top side and the bottom side; and
    a housing body with an opening, the opening completely penetrating through the housing body,
    wherein the optoelectronic semiconductor chip is located inside the opening,
    wherein the bottom side of the optoelectronic semiconductor chip forms a part of a bottom side of the optoelectronic component,
    wherein the housing body exceeds the optoelectronic semiconductor chip at its top side,
    wherein the housing body completely surrounds the optoelectronic semiconductor chip in a lateral direction,
    wherein the opening is bound by an inner side surface of the housing body in the lateral direction,
    wherein the inner side surface of the housing body faces the side surface of the optoelectronic semiconductor chip,
    wherein the housing body is made of a plastic material, wherein a side surface of the optoelectronic component is at least partially formed by an outer side surface of the housing body and shows traces of material removal, and wherein the semiconductor chip is spaced apart from the housing body in all lateral directions.

17. The optoelectronic component according to claim 16, wherein the optoelectronic component is a surface-mountable optoelectronic component, and wherein the bottom side of the optoelectronic semiconductor chip comprises two contact elements for electrically connecting the optoelectronic semiconductor chip.

18. The optoelectronic component according to claim 16, wherein a diameter of the opening decreases in a direction towards the bottom side of the optoelectronic component.

* * * * *